United States Patent
Levy (10) Patent No.: US 10,460,006 B2
(45) Date of Patent: Oct. 29, 2019

(54) METHOD FOR PROCESSING DATA DEFINING AN ELEMENT IN A SPACE E OF DIMENSIONS D, AND ASSOCIATED COMPUTER PROGRAM

(71) Applicant: Inria Institut National De Recherche En Informatique Et En Automatique, Le Chesnay (FR)

(72) Inventor: Bruno Levy, Rosieres aux Salines (FR)

(73) Assignee: Inria Institut National De Recherche En ..., Le Chesnay (FR)

( * ) Notice: Subject to any disclaimer, the term of this patent is extended or adjusted under 35 U.S.C. 154(b) by 838 days.

(21) Appl. No.: 14/433,518

(22) PCT Filed: Oct. 3, 2013

(86) PCT No.: PCT/EP2013/070645
§ 371 (c)(1),
(2) Date: Apr. 3, 2015

(87) PCT Pub. No.: WO2014/053606
PCT Pub. Date: Apr. 10, 2014

(65) Prior Publication Data
US 2015/0254209 A1    Sep. 10, 2015

(30) Foreign Application Priority Data
Oct. 5, 2012    (FR) .................................... 12 59494

(51) Int. Cl.
*G06F 17/50*    (2006.01)
*G06F 17/10*    (2006.01)
*G06T 17/20*    (2006.01)

(52) U.S. Cl.
CPC .......... *G06F 17/10* (2013.01); *G06F 17/5009* (2013.01); *G06T 17/20* (2013.01)

(58) Field of Classification Search
CPC ........................................................ G06F 17/10
USPC ............................................................. 703/1
See application file for complete search history.

(56) References Cited

FOREIGN PATENT DOCUMENTS

FR    2962582 A1    1/2012

OTHER PUBLICATIONS

Sutherland, Ivan, et al., Reentrant Polygon Clipping, Communications of the ACM, vol. 17 No. 1, pp. 32-42, Jan. 1974.
Arya, Sunil, et al., An Optimal Algorithm for Approximate Nearest Neighbor Searching in Fixed Dimensions, Journal of the ACM. vol. 45 No. 6, pp. 891-923 (1-33), 1998.

(Continued)

*Primary Examiner* — Hugh M Jones
(74) *Attorney, Agent, or Firm* — Maynard, Cooper & Gale, P.C.; Brian Sattizahn (57) ABSTRACT

Method for processing data defining an element in a space E or:
a/ we define a set of n points in E;
b/ determined is the intersection between said element and a cell Voroni determined from the point that associates him x, implementing an iterative process that has no current iteration k, it selects an additional point x of the game distinct from x points and the intersection between calculi is half of the space bounded by the hyperplane E mediator of the segment that contains x, and resulting intersection calculi in no previous iteration, the selection of X is function of a comparison between x and x and twice the maximum distance between a bridge and a result of intersection when iterative processing.

14 Claims, 3 Drawing Sheets

(56) References Cited

OTHER PUBLICATIONS

Boissonnat, Jean-Daniel, et al, Algorithmic Geometry, Cambridge University Press ISBN—13:978-0521565295, Section 17-3, p. 416-424, 1998.
Lloyd, Stuart P., Least Squares Quantization in PCM; IEEE Transactions on Information Theory, vol. 28 No. 2: pp. 129-137, Mar. 1982.
Nash, John, The Imbedding Problem for Riemannian Manifolds, Annals of Mathematics; vol. 63, No. 1, p. 20-63, Jan. 1956.
Labelle, Francois. et al., Anisotropic Voronoi Diagrams and Guaranteed-Quality Anisotropic Mesh Generation, In SCG 2003: Proceedings of the Nineteenth Annual Symposium on Computational Geometry, pp. 191-200, Jun. 2003.

METHOD FOR PROCESSING DATA DEFINING AN ELEMENT IN A SPACE E OF DIMENSIONS D, AND ASSOCIATED COMPUTER PROGRAM

BACKGROUND OF THE INVENTION

Field of the Invention

The present invention relates to methods for processing data defining an element in a space E of dimensions d, comprising the following steps:
a/ a set of n points in the space E is defined;
b/ the intersection between said element and Voronoi cells each determined from an associated point among said n defined points is computed.

Such techniques are used, inter alia, for generating a mesh of an element such as a surface or a volume.

Surface meshes are used in many technical applications, for example in digital flow simulation for aeronautical design or for oil exploration, in structural mechanics for the design of frames, bridges and other civil engineering structures, in the mechanics of deformations for simulating automotive impact tests, etc.

Meshing consists in dividing the element under consideration into a set of base cells. Each base cell and the set of base cells as a whole must satisfy predefined validity conditions relating, for example, to the geometric shape of the base cells (square, triangle, tetrahedron, hexahedron, cube, etc.) or to apex angle values (compliance with minimum/maximum angle values). These predefined conditions are dependent, to a large extent, on the intended application of the mesh.

There are several methods for generating a mesh of a domain.

Some methods are known which are based on the optimisation of an "objective" function dependent on the coordinates at the vertices of the cells. Such methods are sometimes referred to as "variational methods".

Some methods use centroidal Voronoi tessellation (CVT) and optimal Delaunay triangulation (ODT).

They allow isotropic meshes to be generated effectively and robustly. These methods are found to be particularly effective especially when an isotropic mesh is to be generated from triangular base cells (mesh of a surface) or tetrahedral base cells (mesh of a volume).

In addition, some applications can require the generation of an anisotropic mesh, that is to say a mesh which has elements which differ from one another in terms of size and/or orientation, in predefined zones of the element. An anisotropic matrix is defined for each base cell specifying those constraints of orientation and size.

Description of Related Art

Document FR 2962582 describes a technique for generating an anisotropic mesh.

Some techniques have appeared in which the anisotropy is replaced by additional dimensions of the space: an anisotropic element of dimension d0, for example 3D, is represented by a corresponding isotropic element of larger dimension d, for example 6D. This is referred to as embedding of the element of dimension d0 in a corresponding element of dimension d.

Figure 1:
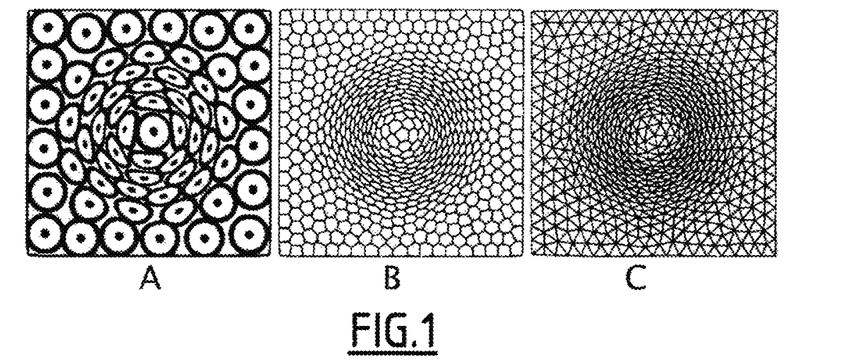
FIG. 1 shows in part A an anisotropic field prescribed on a 2D surface, in part B a resulting Voronoi diagram and in part C the result of the corresponding Delaunay triangulation.
Figure 2:
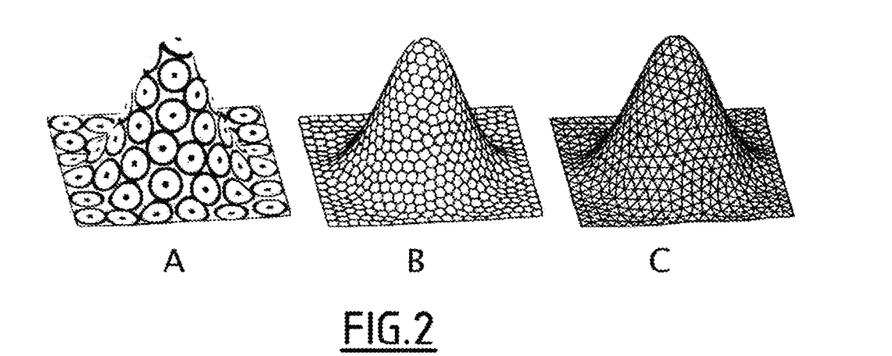
FIG. 2 shows in part A an isotropic D surface, in part B a resulting Voronoi diagram and in part C the result of the corresponding Delaunay triangulation.

By way of illustration, with reference to FIGS. 1 and 2, in order to generate an anisotropic 2D mesh governed by the anisotropic 2D metrics represented in part A of FIG. 1, a corresponding isotropic 3D surface is generated (see part A of FIG. 2).

In part A of FIG. 1, each deformed circle represents the points which are equidistant from the centre of the deformed circle in terms of anisotropic distance defined by the anisotropic metrics under consideration.

According to these techniques, an isotropic Voronoi diagram is then generated for this 3D surface, shown in part B of FIG. 2. An isotropic mesh by Delaunay triangulation, shown in part C of FIG. 2, is then derived from the Voronoi diagram.

The isotropic 3D surfaces shown in parts A, B, C of FIG. 2 are projected onto the plane (xOy) in order to generate the corresponding anisotropic 2D surfaces of parts A, B, C of FIG. 1.

Some of these techniques are explained especially in the following documents, called references_1:

J. F. Nash, The imbedding problem for riemannian manifolds. Annals of Mathematics, 63:20-63, 1956;

F. Labelle and J.-R. Shewchuk, Anisotropic Voronoi diagrams and guaranteed-quality anistropic mesh generation, In SCG '03: Proceedings of the nineteenth annual symposium on Computational geometry, pages 191-200, 2003.

These techniques give good results for the consideration of anisotropy, but embedding in larger dimensions d gives rise to a very considerable increase in the necessary computation volume.

In fact, the computation of a Delaunay triangulation has a complexity proportional to d!, where d is the dimension of the computation space. In general, the embedding space is of dimension 6D, or even 10D, which renders the computation volume prohibitive.

BRIEF SUMMARY OF THE INVENTION

The present invention aims to propose a solution for reducing the computation load in a space of dimension d.

To that end, according to a first aspect, the invention proposes a method for processing data of the type mentioned above, characterised in that in step b/, the result of the intersection between said element and a Voronoi cell determined from the point $x_i$ associated therewith is determined by carrying out an iterative processing in which at a current iteration step k, there is selected an additional point $x_{jk}$ of the set of points other than the point $x_i$, and there is computed an updated intersection result equal to the intersection between, on the one hand, the half of the space E delimited by the hyperplane bisecting the segment $(x_i, x_{jk})$ and which contains $x_i$ and, on the other hand, the intersection result computed at the preceding iteration step, and in which the selection of at least one additional point during the iteration steps is a function of a comparison between the distance between the associated point $x_i$ and said additional point and double the maximum distance between the associated point $x_i$ and a point of an intersection result computed during the iterative processing.

The invention makes it possible to reduce the volume of computations necessary for computing the intersections of the Voronoi cells with the element under consideration, by using a test which allows unnecessary computations to be avoided. It further allows the processing operations for separate Voronoi cells to be parallelised.

In embodiments, the method according to the invention further comprises one or more of the following features:

in step b/, the n−1 other points of the set classified in order of increasing distance relative to the point $x_i$ are denoted $x_{j1}, \ldots x_{jn-1}$, and the iterative processing is carried out by selecting at the current iteration step k the point $x_{jk}$ of the set of points which follows, in said order of increasing distance, the point $x_{jk-1}$ selected at iteration step k−1;

said iterative processing is stopped as a function of a comparison between the distance between the associated point $x_i$ and the point $x_{j+1}$ and double the maximum distance between the associated point $x_i$ and a point of the intersection result computed at iteration step k;

in an initialisation step, the index k is fixed at 1 and the intersection result is fixed to be equal to the element;

steps a/ and b/ are repeated in their entirety, a set of n points taken from at least the preceding set being defined in each new step at;

steps a/ and b/ are repeated in their entirety;

during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, the following steps are carried out:

it is determined whether a vertex q of the updated intersection result is the intersection between the hyperplane bisecting $[x_i, x_p]$ and an edge $[q_1, q_2]$ between two vertices q1, q2 of the element, where $x_p$ is a point of the set of n points;

and if said vertex q is determined as being the intersection between the hyperplane bisecting $[x_i, x_p]$ and an edge $[q_1, q_2]$ between two vertices q1, q2 of the element, the coordinates of q are determined by means of the following formulae:

$q = \lambda_1 q_1 + \lambda_2 q_2$, where $\lambda_1 = \Delta^{-1}(-\|x_p\|^2 + 2 <q_2, x_p>)$ $\lambda_2 = \Delta^{-1}(-\|x_p\|^2 - 2<q_1, x_p>)$ where $\Delta = -2<q_1, x_p> + 2<q_2, x_p>$, and $<.,.>$ represents the function scalar product;

during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, the following steps are carried out:

it is determined whether a vertex q of the updated intersection result is the intersection between the hyperplane bisecting $[x_i, x_p]$, the hyperplane bisecting $[x_i, x_l]$, and a triangle of vertices $q_1, q_2, q_3$ of the element, where $x_p$ and $x_l$ are two points of the set of n points;

and if q is determined as being the intersection between the hyperplane bisecting $[x_i, x_p]$, the hyperplane bisecting $[x_i, x_l]$, and a triangle of vertices $q_1, q_2, q_3$ of the element, the coordinates of q are determined by means of the following formulae:

$q = \lambda_1 q_1 + \lambda_2 q_2 + \lambda_3 q_3$, where $\lambda_1 = \Delta^{-1}[(a_{23}-a_{22})\|x_p\|^2 + (a_{12}-a_{13})\|x_l\|^2 + c_{31}]$;

$\lambda_2 = \Delta^{-1}[(a_{21}-a_{23})\|x_p\|^2 + (a_{13}-a_{11})\|x_l\|^2 + c_{32}]$;

$\lambda_3 = \Delta^{-1}[(a_{22}-a_{21})\|x_p\|^2 + (a_{11}-a_{12})\|x_l\|^2 + c_{33}]$;

where $a_{11} = -2<q_1, x_p>$; $a_{12} = -2<q_2, x_p>$; $a_{13} = -2<q_3, x_p>$ $a_{21} = -2<q_1, x_l>$; $a_{22} = -2<q_2, x_l>$; $a_{23} = -2<q_3, x_l>$ $c_{31} = a_{23}a_{12} - a_{22}a_{13}$; $c_{32} = a_{21}a_{13} - a_{23}a_{11}$; $c_{33} = a_{22}a_{11} - a_{21}a_{12}$ $\Delta = c_{31} + c_{32} + c_{33}$, and $<.,.>$ represents the function scalar product;

during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, comprising the following steps:

it is determined whether a vertex q of the updated intersection result is a vertex of the element;

if said vertex q is determined as being a vertex of the element, the presence of said vertex q in the half of the space E delimited by the hyperplane bisecting the segment $(x_i, x_{jk})$ and which contains $x_i$ is determined as a function of the sign of the function orient $(\Pi^+(i, j_k), q)$ defined by:

orient $(\Pi^+(i, j_k), q) = \text{sign}(\|x_{jk}\|^2 - 2<q, x_{jk}>)$, where $<.,.>$ represents the function scalar product and sign (x) is the function providing the sign of the variable x;

during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step:

it is determined whether a vertex q of the updated intersection result is the intersection between the hyperplane bisecting $[x_i, x_p]$ and an edge $[q_1, q_2]$ between two vertices q1, q2 of the element, where $x_p$ is a point of the set of n points;

if q is determined as being the intersection between the hyperplane bisecting $[x_i, x_k]$ and an edge $[q_1, q_2]$ between two vertices q1, q2 of the element, the presence of said vertex q in the half of the space E delimited by the hyperplane bisecting the segment $(x_i, x_{jk})$ and which contains $x_i$ is determined as a function of the sign of the function orient $(\Pi^+(i, j_k), q)$ defined by:

orient $(\Pi^+(i, j_k), q) = \text{sign} (\Delta\|x_{jk}\|^2 - 2<\Delta q, x_{jk}>).\text{sign} (\Delta)$, where $\Delta = -2<q_1, x_p> + 2<q_2, x_p>$ and where $<.,.>$ represents the function scalar product and sign (x) is the function providing the sign of the variable x;

during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step:

it is determined whether a vertex q of the updated intersection result is the intersection between the hyperplane bisecting $[x_i, x_p]$, the hyperplane bisecting $[x_i, x_l]$, and a triangle of vertices $q_1, q_2, q_3$ of the element, where $x_p$ and $x_l$ are two points of the set of n points;

if said vertex q of the updated intersection result is determined as being the intersection between the hyperplane bisecting $[x_i, x_p]$, the hyperplane bisecting $[x_i, x_l]$, and a triangle of vertices $q_1, q_2, q_3$ of the element, the presence of said vertex q in the half of the space E delimited by the hyperplane bisecting the segment $(x_i, x_{jk})$ and which contains $x_i$ is determined as a function of the sign of the function orient $(\Pi^+(i, j_k), q)$ defined by: orient $(\Pi^+(i, j_k), q) = \text{sign} (\Delta \|x_{jk}\|^2 - 2 < \Delta q, x_{jk}>).\text{sign} (\Delta)$, where $\Delta = c_{31} + c_{32} + c_{33};$ $c_{31} = a_{23}a_{12} - a_{22}a_{13}; \ c_{32} = a_{21}a_{13} - a_{23}a_{11}; \ c_{33} = a_{22}a_{11} - a_{21}a_{12};$ $a_{11} = -2 < q_1, x_p>; \ a_{12} = -2 < q_2, x_p>; \ a_{13} = -2 < q_3, x_p>$ $a_{21} = -2 < q_1, x_l>; \ a_{22} = -2 < q_2, x_l>; \ a_{23} = -2 < q_3, x_l>$ and where <.,.> represents the function scalar product and sign (x) is the function providing the sign of the variable x.

According to a second aspect, the present invention proposes a computer program for processing data defining an element in a space E of dimensions d, said program including instructions for carrying out the steps of a method according to the first aspect of the invention during execution of the program by processing means.

BRIEF DESCRIPTION OF THE DRAWINGS

These features and advantages of the invention will become apparent upon reading the following description, which is given solely by way of example and with reference to the accompanying drawings, in which.

DETAILED DESCRIPTION OF THE INVENTION

Voronoi Diagram and Delaunay Triangulation:
The definitions of a Voronoi diagram and of Delaunay triangulation will first be recalled.

Given a set X of points such that $X = \{x_1, x_2, \ldots, x_n\}$ with $x_i \in R^d$, where R is the real numbers space and d is the dimension under consideration, the Voronoi diagram $\text{Vor}(X)$ is the collection of the Voronoi cells $\text{Vor}(x_i)$, i=1 to n.

The Voronoi cell $\text{Vor}(x_i)$ associated with the point $x_i$ is defined by:

$$\text{Vor}(x_i) = \{x \in R^d / d(x, x_i) \leq d(x, x_j), \forall j = 1 \text{ to } n\}$$

where $d(.,.)$ indicates the Euclidean distance $R^d$.

The dual of the Voronoi diagram $\text{Vor}(X)$, that is to say the abstract simplicial complex derived from the combinatorics of $\text{Vor}(X)$, is called the Delaunay triangulation.

Each pair of Voronoi cells $\text{Vor}(x_i)$, $\text{Vor}(x_j)$ which has a non-zero intersection defines a side $(x_i, x_j)$ in the Delaunay triangulation, and each triplet of Voronoi cells $\text{Vor}(x_i)$, $\text{Vor}(x_j)$, $\text{Vor}(x_k)$ which has a non-zero intersection defines a triangle $(x_i, x_j, x_k)$.

The Delaunay triangulation has several interesting geometric properties and is used in many applications, for example, but not only, mesh generation processing (see Jean-Daniel Boissonnat and Mariette Yvinec. Algorithmic Geometry. Cambridge University Press, 1998).

The centroidal Voronoi tessellation or CVT is a Voronoi diagram in which the point $x_i$, for i=1 to n, is the centre of the Voronoi cell associated with $x_i$.

A CVT can be produced by an algorithm, called Lloyd's relaxation algorithm, which iteratively displaces each point $x_i$ to the centre of $\text{Vor}(x_i)$ and provides isotropic triangles (see Stuart P. Lloyd. Least squares quantization in PCM. IEEE Transactions on Information Theory, 28(2): 129-137, 1982).

Figure 3:
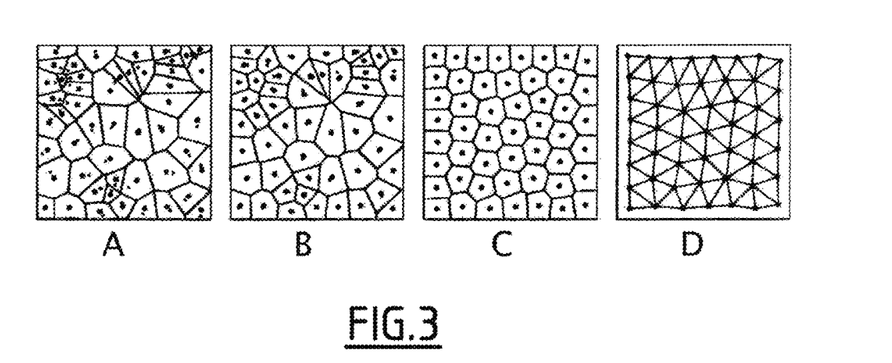
FIG. 3 shows in part A a Voronoi diagram of a set of points, in part B the configuration obtained after one iteration of Lloyd's relaxation algorithm, in part C the configuration obtained after 100 iterations of Lloyd's relaxation algorithm and in part D the result of the Delaunay triangulation resulting from the configuration shown in part C.

With reference to FIG. 3, a 2D Voronoi diagram associated with the points $x_i$ (corresponding to the points which are not in bold) is shown in part A. The centres of the Voronoi cells are shown by bold points. In part B of FIG. 3, the configuration obtained after one iteration of Lloyd's relaxation algorithm is shown. In part C of FIG. 3, the configuration obtained after 100 iterations of Lloyd's relaxation algorithm is shown. In part D of FIG. 3, the Delaunay triangulation derived from the configuration of part C of FIG. 3 is shown.

Now, the notions of restricted Voronoi diagram and restricted Delaunay triangulation have been defined.

Let S be a domain included in $R^d$.

For example, S is a surface or a volume, or any other domain.

The Voronoi diagram of the set X restricted to S, denoted $\text{Vor}(X)|_S$, is the set of Voronoi cells $\text{Vor}(x_i)$, i=1 to n, restricted to S, denoted $\text{Vor}(x_i)|_S$.

The Voronoi cell restricted to S, $\text{Vor}(x_i)|_S$, is equal to $\text{Vor}(x_i)|_S = \text{Vor}(x_i) \cap S$.

The dual of the Voronoi diagram $\text{Vor}(X)$, that is to say the abstract simplicial complex derived from the combinatorics of $\text{Vor}(X)|_S$, is called the restricted Delaunay triangulation. Each triangle of a restricted Delaunay triangulation corresponds to three restricted Voronoi cells having a non-empty intersection.

As a direct consequence of their definition, restricted Voronoi cells can also be defined by $$Vor(x_i)|_s = S \cap \bigcap_{j=1 \text{ to } n, j \neq i} \Pi^+(i, j),$$

where $\Pi^+(i, j) = \{x | d(x, x_i) \leq d(x, x_j)\}$ is the half-space in $R^d$ which is limited by the hyperplane bisecting the segment $[x_i, x_j]$ and which contains $x_i$.

It is thus seen that a restricted Voronoi cell $\text{Vor}(x_i)|_s$ can be obtained by starting from the space $R^d$ and iteratively carrying out divisions by means of the hyperplanes $\Pi^+(i, j)$ for j=1 to n and j≠i.

Applying such an iteration in practice is of no value because the algorithm which would result therefrom would have superquadratic complexity. For that reason, existing algorithms are based on different considerations. There are known, for example, the methods for computing Voronoi diagrams based on the properties of the Delaunay triangulation which are described in the following reference work: "Algorithmic Geometry", Boissonnat and Yvinec, ISBN-13: 978-0521565295. These conventional algorithms compute the Delaunay triangulation directly by inserting the points one by one and correcting the mesh iteratively in order to verify the property called the "empty sphere" property.

Principle of the Safety Radius:

One of the aspects of the invention is to make it possible to determine effectively which of the bisecting hyperplanes defined by the segments $[x_i, x_j]$ contribute to the determination of Voronoi cell $\text{Vor}(x_i)$ and which do not, that is to say $\text{Vor}(x_i) \subset \Pi^+(i, j)$.

Let us consider $x_{j1}, \ldots x_{jn-1}$ to be the n−1 points of the set X other than $x_i$, classified by order of increasing distance from $x_i$.

Let $V_k(x_i)$ be the intersection of the first k bisecting hyperplanes situated between $x_i$ and each of these first k points, and $R_k$ its radius centred on $x_i$, namely:

$$V_k(x_i) = \bigcap_{i=1}^{k} \Pi^+(i, j_i) \text{ and } R_k = \max\{d(x_i, x) / \in V_k(x_i)\}.$$

The safety radius theorem according to the invention is as follows:

For any j such that $(d(x_i, x_j) > 2 \cdot R_k$, the bisecting hyperplane $\Pi^+(i, j)$ does not contribute to the construction of the Voronoi cell $\text{Vor}(x_i)$, i.e. $V_k(x_i) \subset \Pi^+(i, j)$.

Proof: considering $x \in V_k(x_i)$ and $x_j$ such that $d(x_i, x_j) > 2 R_k$,
by definition of $R_k$, $d(x, x_i) < R_k$.
$d(x_i, x) + d(x, x_j) > d(x_i, x_j)$ (triangular inequality)
and $d(x_i, x_j) > 2 R_k$,
consequently $d(x, x_j) > R_k > d(x, x_i)$ and $x \in \Pi^+(i, j)$.

It will be noted that this theorem has advantageous practical applications when it is applied to bounded Voronoi cells, and consequently to restricted Voronoi cells.

Direct consequence of the safety radius theorem:

if $d(x_i, x_{jk+1}) > 2 \cdot R_k$ then $V_k(x_i) = \text{Vor}(x_i)$.

The safety radius is the first value of Rk (i.e. the greatest) which is encountered when running through the $x_{j1}, \ldots x_{jn-1}$ in that order which satisfies that condition "$d(x_i, x_{jk+1}) > 2 \cdot Rk$".

Example of the Application of the Principle of the Safety Radius

In the following, an example of the application of the safety radius theorem to a device and a method for processing data, those data defining a domain S0, is explained.

In the case under consideration, S0 is a surface extending in a space of dimension d0, for example d0=3.

In other cases, S0 may be a volume delimited by a surface, or any other type of domain.

In the case under consideration, the aim of the processing which is carried out is to generate an anisotropic mesh of the domain S0 in accordance with a prescribed an isotropic field.

Figure 4:
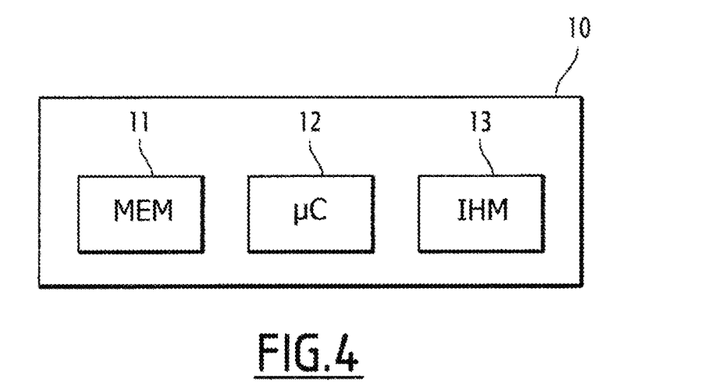
FIG. 4 is a view of a data processing device in one embodiment of the invention.

To that end, let us consider a device 10 for processing data shown in FIG. 4.

Such a processing device 10 comprises a memory 11, a microcomputer 12 and a man-machine interface 13, which comprises especially a screen for displaying a mesh generated for the domain S0.

The memory 10 contains especially digital data defining the domain S0, and a computer program P.

Figure 5:
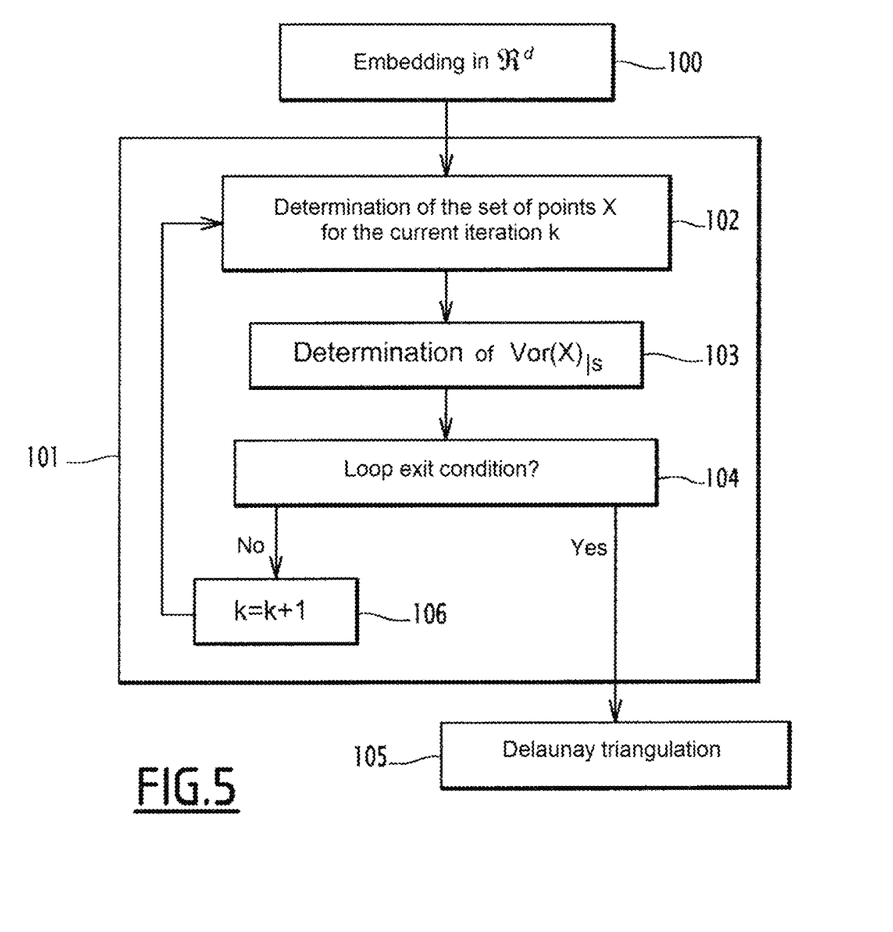
FIG. 5 shows steps of a method in one embodiment of the invention.
Figure 6:
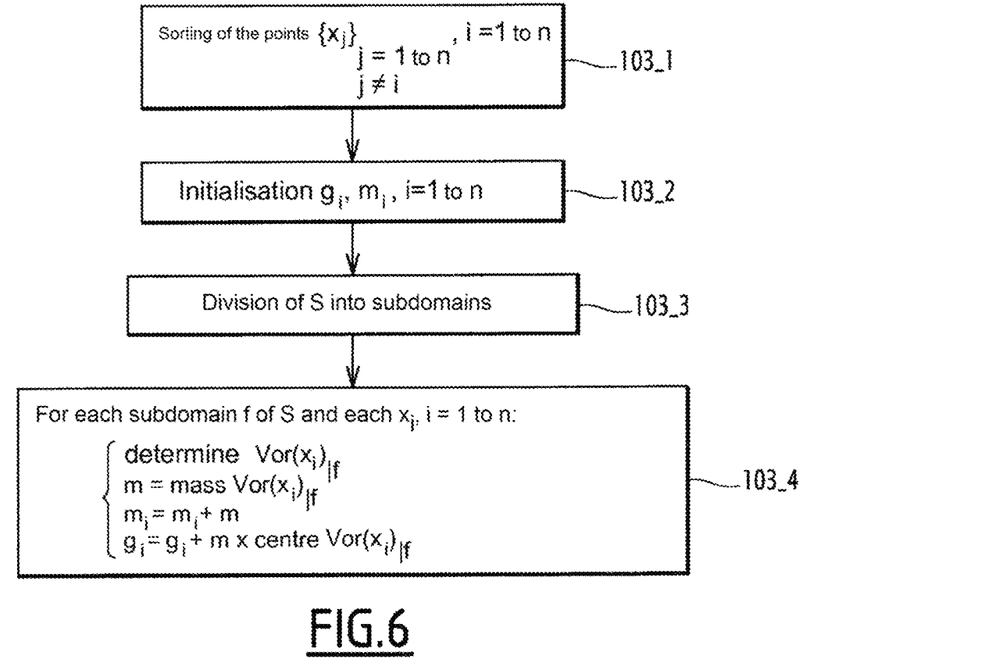
FIG. 6 shows steps of a method in one embodiment of the invention.

The program P includes software instructions which, when executed by the microcomputer 12, carry out the steps indicated below with reference to FIGS. 5-7.

Let the domain of dimension d0 for which an anisotropic mesh governed by a given anistropic metrics is to be generated be S0.

In a step 100, there is made to correspond to the domain S0 of dimension d0 a domain S of dimensions d>d0 in accordance with the documents called references_1 above. For example, d=6 or 10.

For d0=3 and d=6, for any point [x,y,z] of S0, for example, a point $[x,y,z,s.N_x, s.N_y, sN_z]$ of S is made to correspond to point [x,y,z], where the factor s indicates the desired degree of anisotropy (a small value of s generates an isotropic mesh and a large value of s generates an anisotropic mesh). $N_x$, $N_y$, $N_z$ are the unit vectors normal to the surface S0 at the point [x,y,z].

An iterative processing 101 is then carried out in order to determine an isotropic mesh of the domain S.

Accordingly, in a step 102, the value n of the number of Voronoi cells being fixed, a set X of n points of the space $R^d$, $\{x_1, x_2, \ldots, x_n\}$ with $x_1 \in R^d$, is determined for the current iteration.

During the first iteration, the set X of points is, for example, chosen randomly.

Then, during the following iterations, the set X is determined as a function of the results of the last iteration carried out for the processing 101.

In a step 103, a step of determining the Voronoi diagram restricted to S, that is to say $\text{Vor}(x_i)|_s$, is carried out.

In a step 104, a loop exit condition is tested. This loop exit condition comprises, for example:
- a comparison between the current iteration value k and a fixed maximum threshold; and/or
- the normal of the gradient of an "objective" function is below a certain threshold. For example, the "objective" function represents the quantisation noise power, that is to say the sum of the moments of inertia of the Voronoi cells.

If the loop exit condition 105 is not satisfied, the value of k is increased by 1 and an additional iteration of the processing 101 is carried out.

If the loop exit condition 104 is satisfied, the iterative processing 101 is stopped. A step 105 of restricted Delaunay triangulation is then carried out in order to determine the dual of the Voronoi diagram provided at the end of the iterative processing 101 by direct deduction from the combinatorics of the restricted Voronoi diagram, that is to say for each vertex of the restricted Voronoi diagram, the corresponding Delaunay triangle is generated.

Various operations can then be carried out, especially the projection onto the initial space of dimension d0 of the result of the Delaunay triangulation obtained in the space of dimension d at the end of the iterative treatment 101, so as to obtain the desired anisotropic mesh of the domain S0.

In the embodiment under consideration, the step 103 of determining Vor(x)|$_s$ is carried out in the manner indicated below with reference to FIG. 6:

In a step 103_1, for each $x_i$, where i=1 to n, the other points $x_j$, j=1 to n and j≠i, are sorted by order of increasing distance from $x_i$, which results in an ordered list $x_{j1}, \ldots x_{jn-1}$. To that end, the ANN tool, for example, is used (David M. Mount and Sunil Arya, ANN: A library for approximate nearest neighbor searching. In Proceedings CGC Workshop on Computational Geometry, pages 33-40, 1997).

In an initialisation step 103_2, the variable $m_i$ and each of the coordinates of points $g_i$ of $R^d$, i=1 to n, are initialised with the value 0.

In a step 103_3, the domain S is divided into subdomains in order to allow the steps carried out on separate subdomains (triangles, tetrahedrons, etc.) to be parallelised.

In the case under consideration, the subdomains f of the surface S are triangles.

In a step 103_4, for each point $x_i$, where i=1 to n, and for each subdomain f such that the intersection between the subdomain f and the Voronoi cell associated with $x_i$ is not empty, Vor($x_i$)|$_f$, the Voronoi cell associated with $x_i$ and restricted to the subdomain $f_i$ is determined in the manner indicated below with reference to FIG. 7.

The value of the "mass" of Vor($x_i$)|$_f$ is then allocated to a variable $m_i$ the value of m is added to the current value of $m_i$, and the value of the coordinates of the point $g_i$ is updated according to the formula: $g_i=g_i+m$.centre Vor($x_i$)|$_f$, where centre Vor($x_i$)|$_f$ is the centre of gravity of Vor($x_i$)|$_f$.

The "mass" of Vor($x_i$)|$_f$ is equal to $$\int_{x \in Vor(x_i)|_f} dx.$$

Accordingly, the "mass" of Vor($x_i$)|$_f$ is the area of Vor($x_i$)|$_f$ if Vor($x_i$)|$_f$ is a surface, the volume of Vor($x_i$)|$_f$ if Vor($x_i$)|$_f$ is a volume, the hyper-volume of Vor($x_i$)|$_f$ if Vor($x_i$)|$_f$ has a dimension greater than or equal to 4.

The centre of gravity of Vor($x_i$)|$_f$ is $$\frac{1}{mass\ of\ Vor(x_i)|_f} \int_{Vor(x_i)|_f} x.dx.$$

In one embodiment, the determination of the set of points X in a step 102 for iteration k+1 of the processing 101 is, for example, such that the point $x_i=g_i.1/m_i$, where i=1 to n and $g_i$ is the point obtained at the end of step 103_4 carried out for iteration k of the processing 101.

According to the invention, step 103_4 of determining the Voronoi cell Vor($x_i$)|$_f$ associated with $x_i$ and restricted to the subdomain f is carried out using the safety radius theorem, and considering the points $x_{j1}, \ldots x_{jn-1}$ in order of increasing distance from $x_i$.

Figure 7:
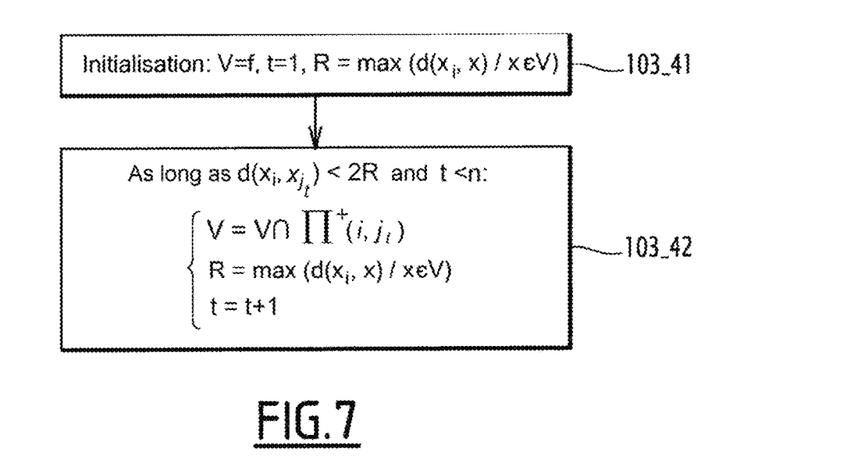
FIG. 7 shows steps of a method in one embodiment of the invention.

In an exemplary embodiment, with reference to FIG. 7, step 103_4 thus comprises the following operations.

In an initialisation step 103_41 a domain V equal to the subdomain f under consideration, a value t equal to 1 and a value R equal to max{d($x_i$, x)/x∈V} are considered.

In a step 103_42, the following steps are iterated as long as d($x_i$, $x_{jt}$)<2R and t<n:

$V=V \cap \Pi^+(i, j_t);$ $R=\max\{d(x_i, x)/x \in V\};$ $t=t+1.$

When d($x_i$, $x_{jt}$)≥2R or t=n, step 103_42 is stopped.

And the current value of V is then equal to the Voronoi cell Vor($x_i$)|$_f$ associated with $x_i$ and restricted to the subdomain f (continuing the iterations of step 103_42 is no further use since the bisecting hyperplanes which have not yet been taken into account do not contribute).

For the effective computation of the intersection $V \cap \Pi^+(i, j_t)$, Sutherland & Hodgman's reentrant polygon clipping algorithm may be used, for example (Ivan Sutherland and Gary W. Hodgman, Reentrant polygon clipping. Communications of the ACM, 17:32-42, 1974).

The use of the safety radius theorem makes it possible to determine only the sections of the Voronoi cell which are of use for computing the intersection between that cell and the subdomain f under consideration, thus greatly reducing the necessary computation volume, which is very considerable especially when the value of the dimension d of the space under consideration increases.

In addition, it allows the intersections for respective Voronoi cells to be computed in parallel and independently.

In one embodiment, a method according to the invention carries out the steps indicated below in order to define the intersection between a subdomain f and a Voronoi cell in a space of dimensions d, using the scalar products and the linear combination of vectors, the computation volume carried out being independent of the dimension d.

It will be noted that these steps can be carried out independently of the use of the so-called safety radius test.

In the step of computing $V \cap \Pi^+(i, j_t)$ by means of Sutherland & Hodgman's reentrant polygon clipping algorithm, it is necessary to determine the coordinates of the new vertices of the domain resulting from this intersection, and also to determine the side on which a vertex is situated relative to a half-space $\Pi^+(i, j)$.

The function which makes it possible to determine the side on which a vertex q is situated relative to the half-space $\Pi^+(i, j)$ is called orient ($\Pi^+(i, j), q$). If the result of orient ($\Pi^+(i, j), q$) is positive, the vertex q is situated in the half-space $\Pi^+(i, j)$.

Otherwise, the vertex q is outside the half-space $\Pi^+(i, j)$.

Vertices q of the resulting domain in some cases have already been determined during preceding iteration(s) or only appear in the current iteration.

Three different configurations exist for a vertex q:

a- q is a vertex of the subdomain f under consideration;

b- q is the intersection between the hyperplane bisecting [$x_i$, $x_k$] and an edge [$q_1$, $q_2$] between two vertices $q_1$, $q_2$ of the subdomain f;

c- q is the intersection between two bisecting hyperplanes (for example the hyperplane bisecting [$x_i$, $x_k$] and the hyperplane bisecting [$x_i$, $x_l$]) and the subdomain f; in the present case, the subdomain is the triangle of vertices $q_1$, $q_2$, $q_3$.

Without loss of generality, $x_i$ is assumed to be at the origin of the space under consideration. Return thereto is achieved by applying a translation.

In case a/, the coordinates of q are known and orient ($\Pi^+(i, j), q$)=sign ($\|x_j\|^2 - 2<q, x_j>$), where <,> represents the function scalar product.

In case b/, the barycentric coordinates ($\lambda_1$, $\lambda_2$) of q relative to $q_1$, $q_2$ are determined: $q=\lambda_1 q_1 + \lambda_2 q_2$.

$$\begin{bmatrix} \lambda_1 \\ \lambda_2 \end{bmatrix} = \begin{bmatrix} 2\langle q_1, (x_i - x_k) \rangle & 2\langle q_2, (x_i - x_k) \rangle \\ 1 & 1 \end{bmatrix}^{-1} \begin{bmatrix} \|x_i\|^2 - \|x_k\|^2 \\ 1 \end{bmatrix}$$

By calling $\Delta$ the determinant of the 2×2 matrix above:

$$\Delta = -2\langle q_1, x_k \rangle + 2\langle q_2, x_k \rangle$$

$$\lambda_1 = \Delta^{-1}(-\|x_k\|^2 + 2\langle q_2, x_k \rangle) \text{ and } \lambda_2 = \Delta^{-1}(\|x_k\|^2 + 2\langle q_1, x_k \rangle)$$

and orient $(\Pi^+(i, j), q) = \text{sign } (\Delta\|x_j\|^2 - 2\langle \Delta q, x_j \rangle) \cdot \text{sign } (\Delta)$.

In case c/, the barycentric coordinates $(\lambda_1, \lambda_2, \lambda_3)$ of q relative to $q_1, q_2, q_3$ are determined: $q = \lambda_1 q_1 + \lambda_2 q_2 + \lambda_3 q_3$.

$$\begin{bmatrix} \lambda_1 \\ \lambda_2 \\ \lambda_3 \end{bmatrix} =$$

$$\begin{bmatrix} 2\langle q_1, (x_i - x_k) \rangle & 2\langle q_2, (x_i - x_k) \rangle & 2\langle q_3, (x_i - x_k) \rangle \\ 2\langle q_1, (x_i - x_l) \rangle & 2\langle q_2, (x_i - x_l) \rangle & 2\langle q_3, (x_i - x_l) \rangle \\ 1 & 1 & 1 \end{bmatrix}^{-1} \begin{bmatrix} \|x_i\|^2 - \|x_k\|^2 \\ \|x_i\|^2 - \|x_l\|^2 \\ 1 \end{bmatrix}$$

$$a_{11} = -2\langle q_1, x_k \rangle; \ a_{12} = -2\langle q_2, x_k \rangle; \ a_{13} = -2\langle q_3, x_k \rangle$$
$$a_{21} = -2\langle q_1, x_l \rangle; \ a_{22} = -2\langle q_2, x_l \rangle; \ a_{23} = -2\langle q_3, x_l \rangle.$$

The following cofactors are computed:

$$c_{31} = a_{23}a_{12} - a_{22}a_{13}; \ c_{32} = a_{21}a_{13} - a_{23}a_{11}; \ c_{33} = a_{22}a_{11} - a_{21}a_{12}$$

$\Delta$ being the development of the determinant relative to the last line of the 3×3 matrix: $\Delta = c_{21} + c_{32} + c_{33}$.

It follows therefrom:

$$\lambda_1 = \Delta^{-1}[(a_{23} - a_{22})\|x_k\|^2 + (a_{12} - a_{13})\|x_l\|^2 + c_{31}];$$

$$\lambda_2 = \Delta^{-1}[(a_{21} - a_{23})\|x_k\|^2 + (a_{13} - a_{11})\|x_l\|^2 + c_{32}];$$

$$\lambda_3 = \Delta^{-1}[(a_{22} - a_{21})\|x_k\|^2 + (a_{11} - a_{12})\|x_l\|^2 + c_{33}];$$

and orient $(\Pi^+(i, j), q) = \text{sign } (\Delta\|x_j\|^2 - 2\langle \Delta q, x_j \rangle) \cdot \text{sign } (\Delta)$.

The formulation of q and of the function orient is therefore independent of the dimension d, in that only the scalar product $\langle .,. \rangle$ and linear combinations are involved, and where the dimension of the linear systems is independent of d.

Furthermore, it lends itself well to an implementation in arbitrary-precision arithmetic and arithmetic with filtering (by interval arithmetic or quasi-static filters).

The recentring (translation of $x_i$ to the origin) improves the filtering performances.

The algorithm implementing these steps of computation of the coordinates of q and of the function orient is parameterised by a geometric nucleus defining the types of points and vectors, the scalar product and the linear combinations of vectors. This makes it possible to have an implementation which works whatever the dimension d.

In the example described above, the subdomain f has been considered to be a triangle. However, the formulae given above are equally valid for any subdomain $f_i$ for example an arbitrary polygon or any object of larger dimension, for example a tetrahedron (these formulae are therefore applicable in the case of a volume mesh).

The use of the safety radius theorem for reducing the computations of a restricted Voronoi diagram or a restricted Delaunay triangulation has been described above within the context of an application to the mesh of an element. Of course, it can be involved in other fields which employ such computations, and can provide the same advantages.

The same is true of the principles of computation of the vertices resulting from the intersections independently of the dimension d, and of the function orient.

These features are very advantageous, for values of d equal to 2, 3 or greater than or equal to 4.

The applications of a technique according to the invention other than meshing include, for example:

applications in 3D reconstruction, especially the steps of passing from a scatter plot to a surface;

applications in robotics: for example in the representation of configuration spaces, or the management of fleets of autonomous robots or the planning of trajectories;

applications in astrophysics: for example computations in phase spaces;

applications in artificial intelligence, such as document searches ("google" type, which also uses spaces of large dimensions).

The invention claimed is:

1. Method for processing data defining an element in a space E of dimensions d, said method comprising the following steps:
a/ a set of n points in said space E is defined in a computer;
b/ a plurality of intersections between said element and Voronoi cells each determined from an associated point among said n defined points is computed by the computer; in step b/, the result of the intersection between said element and a Voronoi cell determined from the point $x_i$, associated therewith is determined by carrying out an iterative processing in which;
at a current iteration step k, there is selected an additional point $x_{jk}$ of the set of points other than the point $x_i$, and there is computed an updated intersection result equal to the intersection between, on the one hand, the half of the space E delimited by the hyperplane bisecting the segment $(x_i, x_{jk})$ and which contains $x_i$ and, on the other hand, the intersection result computed at the preceding iteration step, and
the selection of at least one additional point during the iteration steps is a function of a comparison between the distance between the associated point $x_i$ and said additional point and double the maximum distance between the associated point $x_i$ and a point of an intersection result computed during the iterative processing;
generating, by the computer, a mesh of the element from the plurality of intersections computed in step b/; and
performing a physics numerical simulation based on the generated mesh with the computer.

2. Method according to claim 1, in which in step b/, the n−1 other points of the set classified in order of increasing distance relative to the point $x_i$ are denoted $x_{j1}, \ldots x_{jn-1}$, and the iterative processing is carried out by selecting at the current iteration step k the point $x_{jk}$ of the set of points which follows, in said order of increasing distance, the point $x_{jk-1}$ selected at iteration step k−1.

3. Method according to claim 2, in which said iterative processing is stopped as a function of a comparison between the distance between the associated point $x_i$ and the point $x_{jk+1}$ and double the maximum distance between the associated point $x_i$ and a point of the intersection result computed at iteration step k.

4. Method according to claim 1, in which in an initialisation step, the index k is fixed at 1 and the intersection result is fixed to be equal to the element.

5. Method according to claim 1, in which steps a/ and b/ are repeated in their entirety, a set of n points taken from at least the preceding set being defined in each new step a/.

6. Method according to claim 1, in which steps a/ and b/ are repeated in their entirety.

7. Method according to claim 1, in which, during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, the following steps are carried out:

it is determined whether a vertex q of the updated intersection result is the intersection between the hyperplane bisecting $[x_i, x_p]$ and an edge $[q_1, q_2]$ between two vertices q1, q2 of the element, where $x_p$ is a point of the set of n points;

and if said vertex q is determined as being the intersection between the hyperplane bisecting $[x_i, x_p]$ and an edge $[q_1, q_2]$ between two vertices q1, q2 of the element, the coordinates of q are determined by means of the following formulae:

$q = \lambda_1 q_1 + \lambda_2 q_2$, where $\lambda_1 = \Delta^{-1}(-\|x_p\|^2 + 2<q_2, x_p>)$ $\lambda_2 = \Delta^{-1}(\|x_p\|^2 - 2<q_1, x_p>)$ where $\Delta = -2<q_1, x_p> + 2<q_2, x_p>$, and $<.,.>$ represents the function scalar product.

8. Method according to claim 1, in which, during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, the following steps are carried out:

it is determined whether a vertex q of the updated intersection result is the intersection between the hyperplane bisecting $[x_i, x_p]$, the hyperplane bisecting $[x_i, x_l]$, and a triangle of vertices $q_1, q_2, q_3$ of the element, where $x_p$ and $x_l$ are two points of the set of n points;

and if q is determined as being the intersection between the hyperplane bisecting $[x_i, x_p]$, the hyperplane bisecting $[x_i, x_l]$, and a triangle of vertices $q_1, q_2, q_3$ of the element, the coordinates of q are determined by means of the following formulae:

$q = \lambda_1 q_1 + \lambda_2 q_2 + \lambda_3 q_3$, where $\lambda_1 = \Delta^{-1}[(a_{23}-a_{22})\|x_p\|^2 + (a_{12}-a_{13})\|x_l\|^2 + c_{31}]$;

$\lambda_2 = \Delta^{-1}[(a_{21}-a_{23})\|x_p\|^2 + (a_{13}-a_{11})\|x_l\|^2 + c_{32}]$;

$\lambda_3 = \Delta^{-1}[(a_{22}-a_{21})\|x_p\|^2 + (a_{11}-a_{12})\|x_l\|^2 + c_{33}]$ where $a_{11} = -2<q_1, x_p>$; $a_{12} = -2<q_2, x_p>$; $a_{13} = -2<q_3, x_p>$ $a_{21} = -2<q_1, x_l>$; $a_{22} = -2<q_2, x_l>$; $a_{23} = -2<q_3, x_l>$ $c_{31} = a_{23}a_{12} - a_{22}a_{13}$; $c_{32} = a_{21}a_{13} - a_{23}a_{11}$; $c_{33} = a_{22}a_{11} - a_{21}a_{12}$ $\Delta = c_{31} + c_{32} + c_{33}$, and $<.,.>$ represents the function scalar product.

9. Method according to claim 1, in which, during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, the following steps are carried out:

it is determined whether a vertex q of the updated intersection result is a vertex of the element;

if said vertex q is determined as being a vertex of the element, the presence of said vertex q in the half of the space E delimited by the hyperplane bisecting the segment $(x_i, x_{jk})$ and which contains x, is determined as a function of the sign of the function orient $(\Pi^+(i, j_k), q)$ defined by:

orient $(\Pi^+(i, j_k), q) = \text{sign}(\|x_{jk}\|^2 - 2<q, x_{jk}>)$, where $<.,.>$ represents the function scalar product and sign (x) is the function providing the sign of the variable x.

10. Method according to claim 1, in which, during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step, the following steps are carried out:

it is determined whether a vertex q of the updated intersection result is the intersection between the hyperplane bisecting $[x_i, x_p]$ and an edge $[q_1, q_2]$ between two vertices q1, q2 of the element, where $x_p$ is a point of the set of n points;

if q is determined as being the intersection between the hyperplane bisecting $[x_i, x_k]$ and an edge $[q_1, q_2]$ between two vertices q1, q2 of the element, the presence of said vertex q in the half of the space E delimited by the hyperplane bisecting the segment $(x_i, x_{jk})$ and which contains $x_i$, is determined as a function of the sign of the function orient $(\Pi^+(i, j_k), q)$ defined by:

orient $(\Pi^+(i, j_k), q) = \text{sign}(\Delta\|x_{jk}\|^2 - 2<\Delta q, x_{jk}>).\text{sign}(\Delta)$, where $\Delta = -2<q_1, x_p> + 2<q_2, x_p>$ and where $<.,.>$ represents the function scalar product and sign (x) is the function providing the sign of the variable x.

11. Method according to claim 1, in which, during the step of computing an updated intersection result equal to the intersection between, on the one hand, the half of the space E delimited by a hyperplane bisecting a segment $(x_i, x_{jk})$ and which contains $x_i$ and, on the other hand, the intersection result computed at the preceding iteration step:

it is determined whether a vertex q of the updated intersection result is the intersection between the hyperplane bisecting $[x_i, x_p]$, the hyperplane bisecting $[x_i, x_l]$, and a triangle of vertices $q_1, q_2, q_3$ of the element, where $x_p$ and $x_l$ are two points of the set of n points;

if said vertex q of the updated intersection result is determined as being the intersection between the hyperplane bisecting $[x_i, x_p]$, the hyperplane bisecting $[x_i, x_l]$, and a triangle of vertices $q_1, q_2, q_3$ of the element, the presence of said vertex q in the half of the space E delimited by the hyperplane bisecting the segment $(x_i, x_{jk})$ and which contains $x_i$ is determined as a function of the sign of the function orient $(\Pi^+(i, j_k), q)$ defined by: orient $(\Pi^+(i, j_k), q) = \text{sign}(\Delta\|x_{jk}\|^2 2<\Delta q, x_{jk}>).\text{sign}$, where $\Delta = c_{31} + c_{32} + c_{33}$;

$c_{31} = a_{23}a_{12} - a_{22}a_{13}$; $c_{32} = a_{21}a_{13} - a_{23}a_{11}$; $c_{33} = a_{22}a_{11} - a_{21}a_{12}$;

$a_{11} = -2<q_1, x_p>$; $a_{12} = -2<q_2, x_p>$; $a_{13} = -2<q_3, x_p>$ $a_{21} = -2<q_1, x_l>$; $a_{22} = -2<q_2, x_l>$; $a_{23} = -2<q_3, x_l>$ and where <.,.> represents the function scalar product and sign (x) is the function providing the sign of the variable x.

12. Computer program embodied a non-transitory computer readable medium and executable by a microcomputer for processing data defining an element in a space E of dimensions d, said program including instructions for carrying out the steps of a method according to claim 1.

13. Method according to claim 1, wherein the element is one of a surface or volume.

14. Method according to claim 1, further comprising performing step b/ for each point of said n defined points in parallel.

* * * * *